United States Patent [19]

Loomis et al.

[11] Patent Number: 4,612,700
[45] Date of Patent: Sep. 23, 1986

[54] COMPONENT INSERTION APPARATUS

[75] Inventors: Phillip E. Loomis, Harrisburg; Edward J. Paukovits, Jr., Hummelstown; Leo V. Schuppert, Jr., York; Richard V. Spong, Etters, all of Pa.

[73] Assignee: AMP Incorporated, Harrisburg, Pa.

[21] Appl. No.: 727,708

[22] Filed: Apr. 26, 1985

[51] Int. Cl.$^4$ ............................................. H05K 13/04
[52] U.S. Cl. .................................. 29/564.6; 29/566.2; 29/741
[58] Field of Search ................. 29/564.3, 564.6, 564.8, 29/566.1, 566.2, 566, 566.3, 564.7, 739, 741, 822, 798, 837, 845, 33 M; 140/93 D, 105; 227/2, 79, 155

[56] References Cited

U.S. PATENT DOCUMENTS

| | | | |
|---|---|---|---|
| 3,497,939 | 3/1970 | Saint-Pierre et al. | 29/739 X |
| 3,972,100 | 8/1976 | Zemek et al. | 29/739 X |
| 4,051,593 | 10/1977 | Mori et al. | 29/741 X |
| 4,063,347 | 12/1977 | Woodman, Sr. | 29/741 X |
| 4,205,433 | 6/1980 | Araki et al. | 29/741 X |
| 4,293,998 | 10/1981 | Kawa et al. | 29/741 X |
| 4,294,000 | 10/1981 | Takahashi et al. | 29/566.2 X |
| 4,551,901 | 11/1985 | Bonifanti et al. | 29/564.6 |

Primary Examiner—Gil Weidenfeld
Assistant Examiner—Glenn L. Webb
Attorney, Agent, or Firm—Thomas G. Terrell

[57] ABSTRACT

Apparatus for severing components for example, electrical posts, from a strip of such components and for inserting each severed component into a workpiece, for example, a circuit board, comprises a row of strip feed units, each for feeding a different strip of components towards strip severing and component insertion means. The row of units can be shifted lengthwise thereof to align a selected one of the units, at a time, with the severing and insertion means, in accordance with a component insertion program, the insertion means is adjustable, also according to the program to insert the components to selected depths.

16 Claims, 27 Drawing Figures

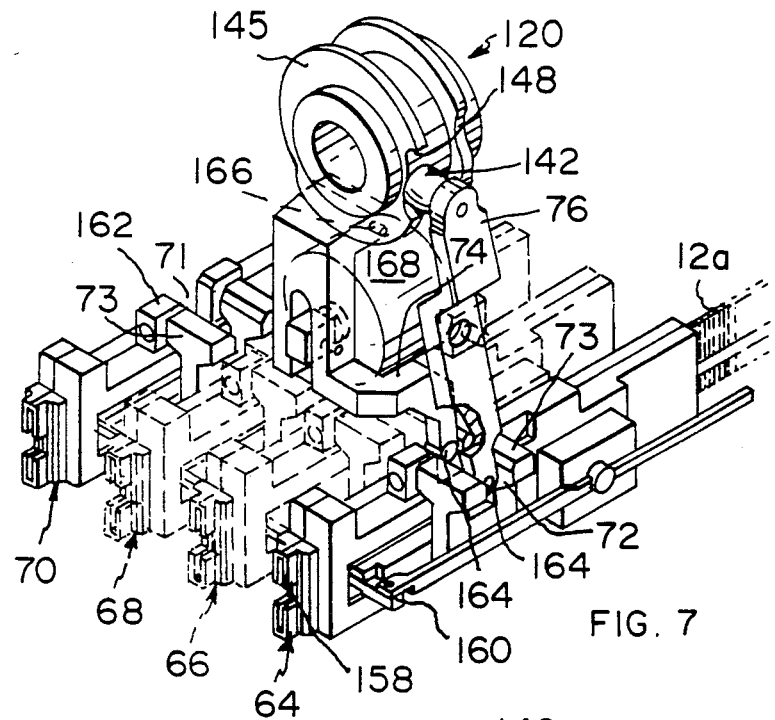
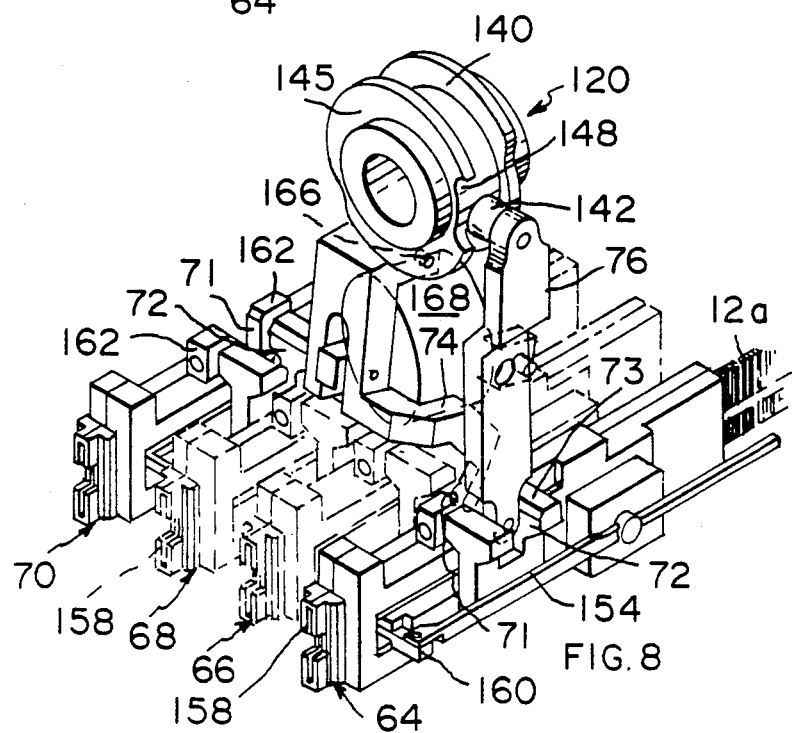

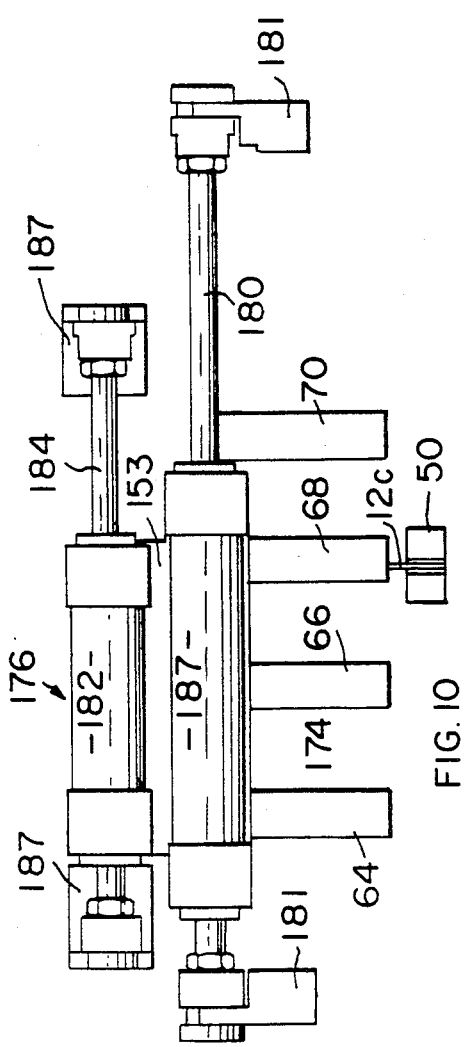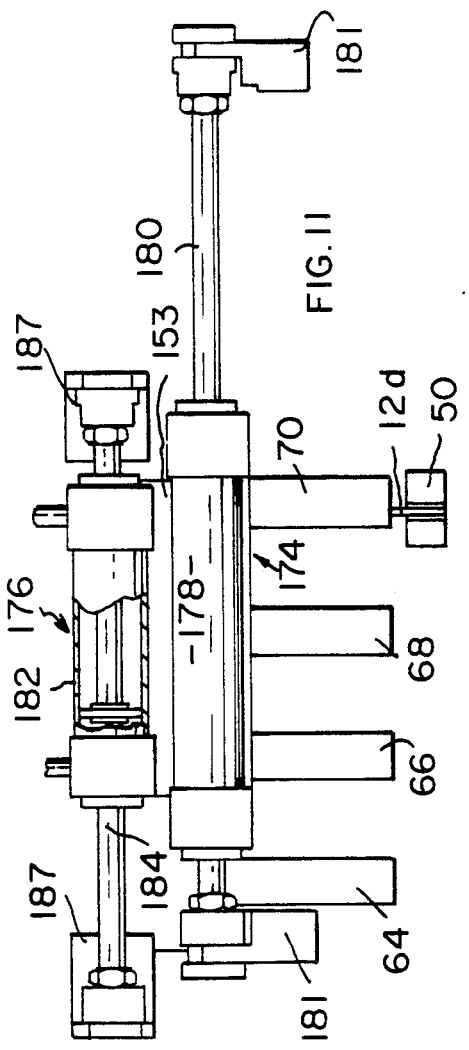

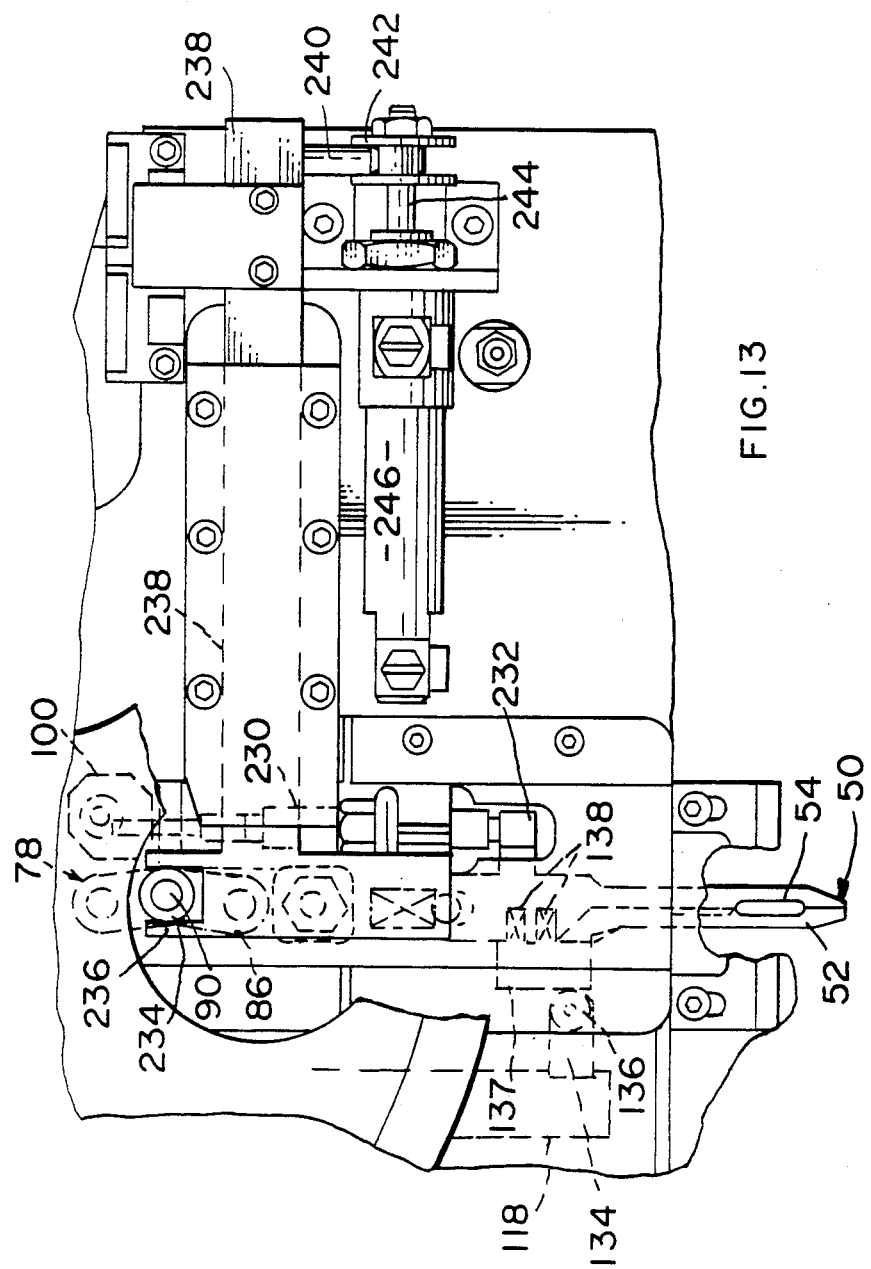

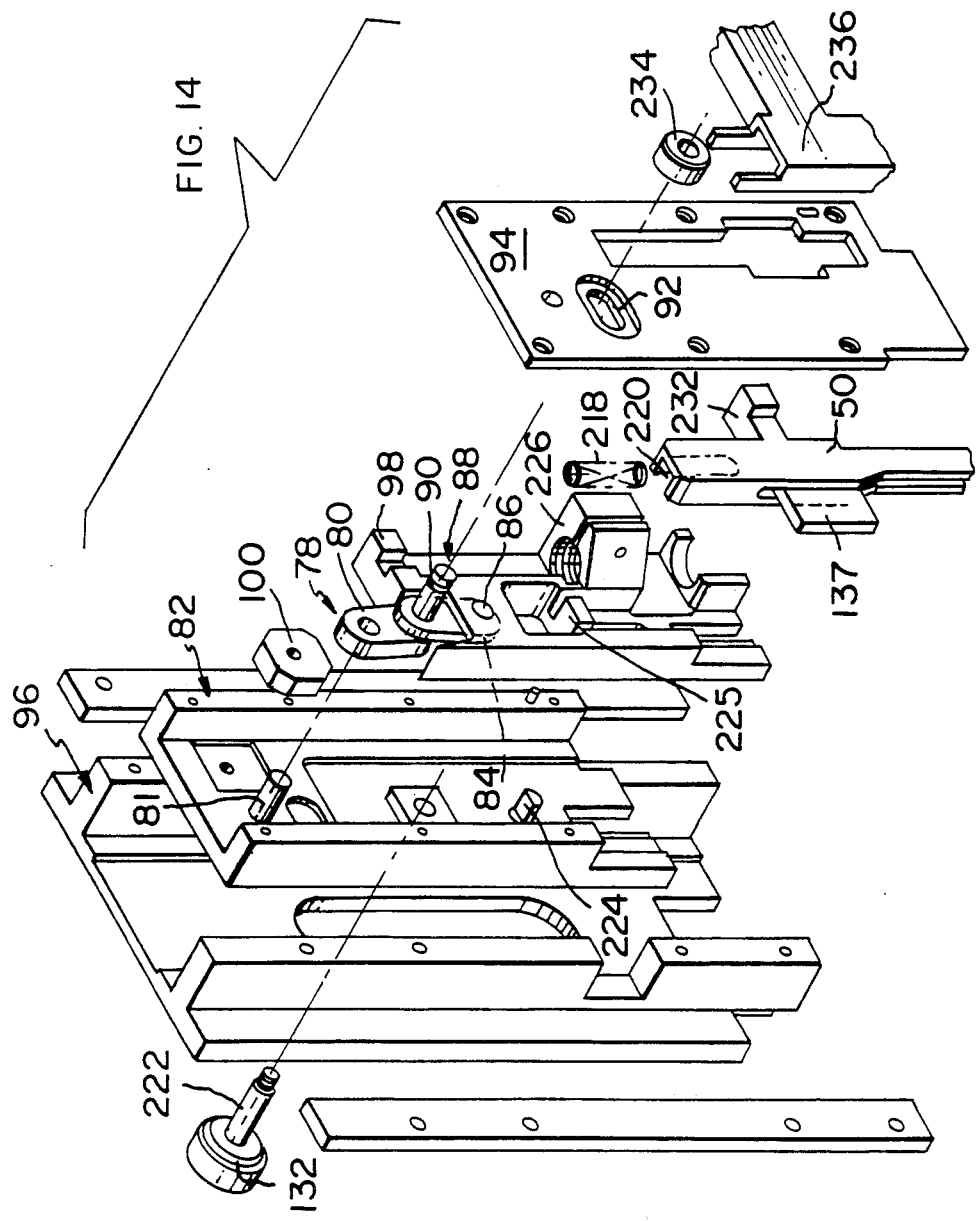

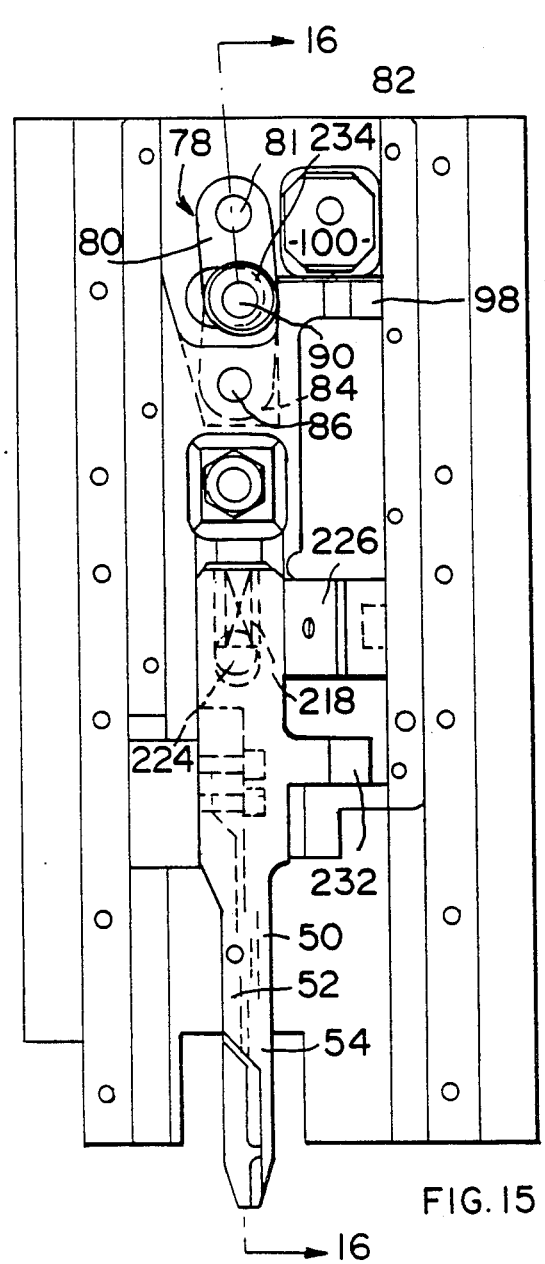
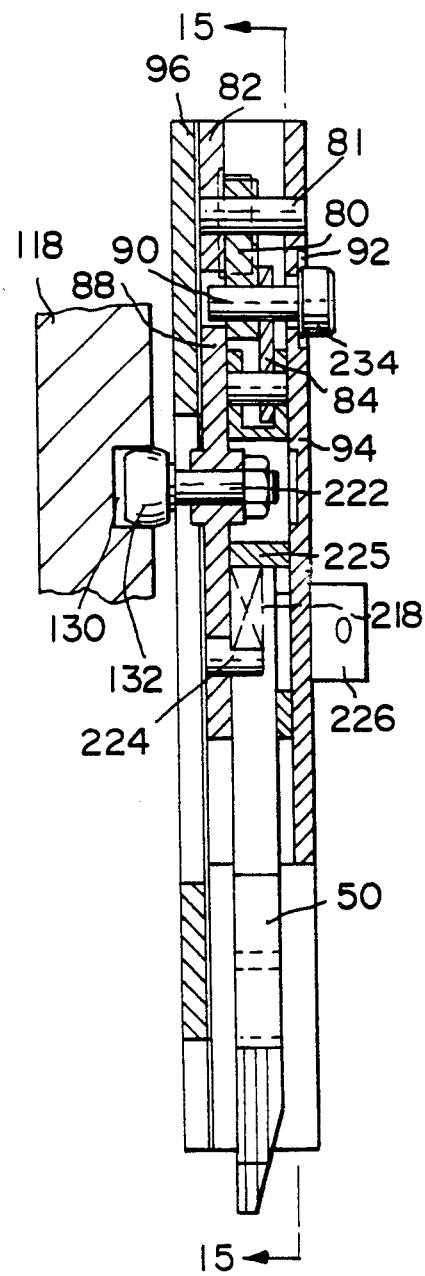
FIG. 15
FIG. 16

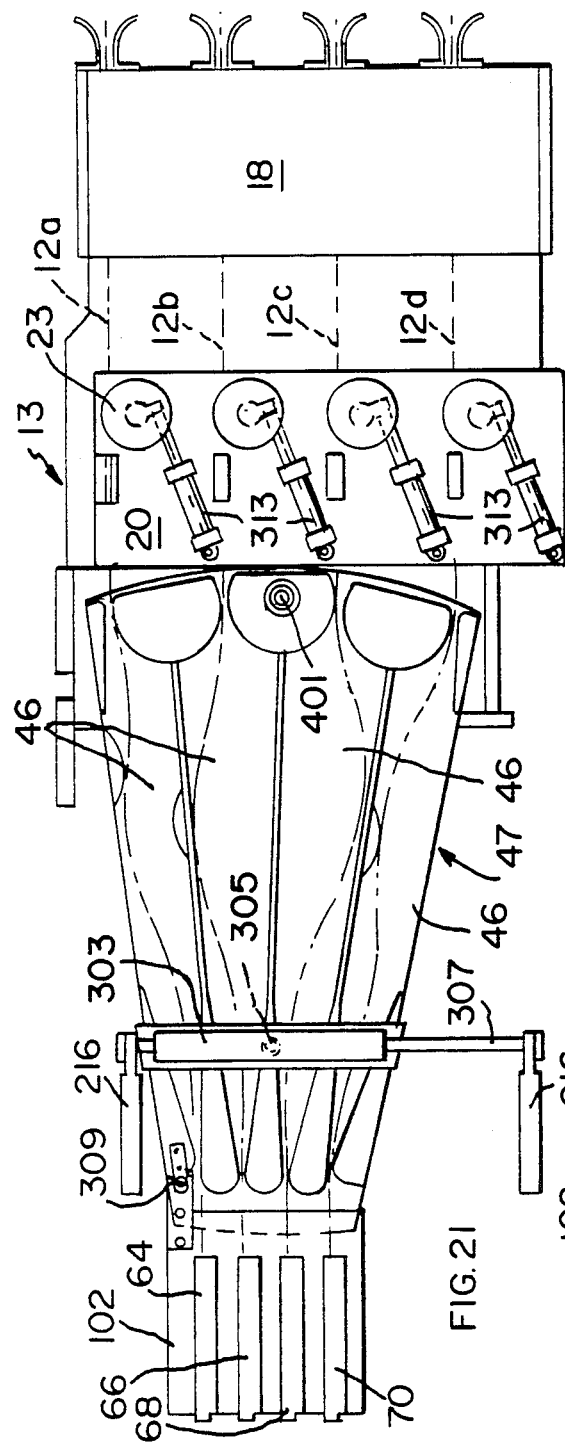
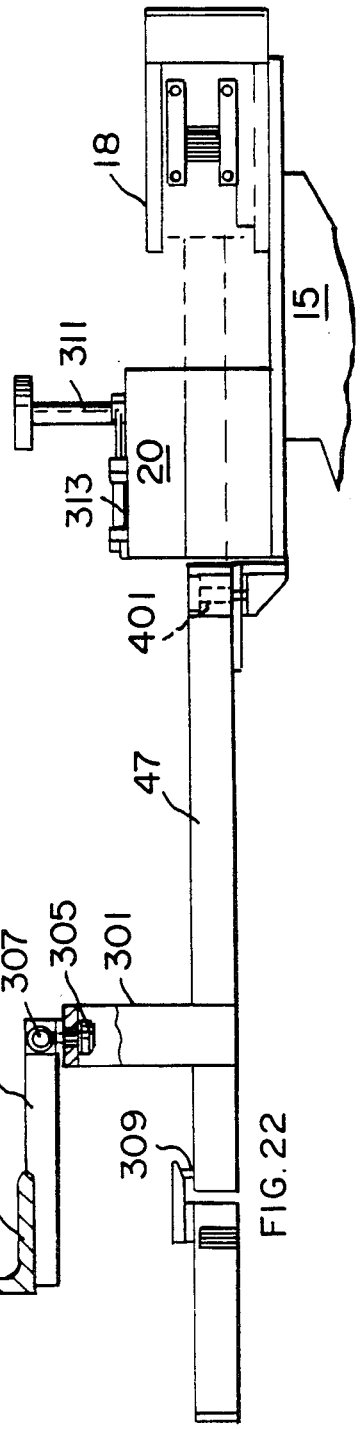
FIG. 21
FIG. 22

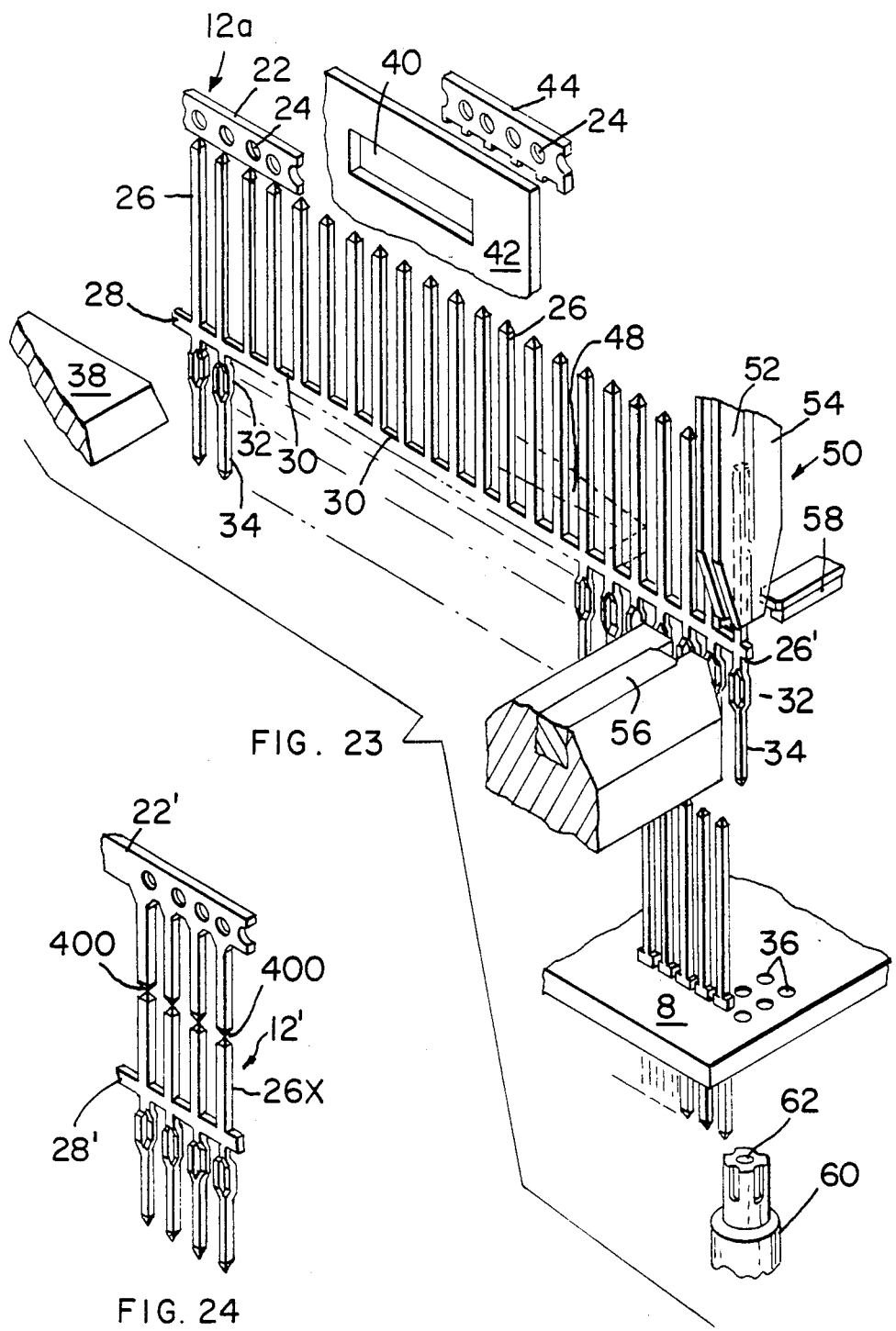

COMPONENT INSERTION APPARATUS

This invention relates to apparatus for severing components, for example, electrical posts, from a strip of such components and for inserting each severed component into a workpiece, for example, a circuit board.

Such apparatus are disclosed, for example, in U.S. Pat. No. 3,276,653 and in patent application Ser. No. 582,996, U.S. Pat. No. 4,551,901 filed on Feb. 24, 1984, and which is incorporated herein by reference. These apparatus are capable of processing only a single strip of components and so are capable of inserting into the workpiece only identical components unless the apparatus be stopped and the strip be replaced by another. Since it is sometimes a customer requirement that the finished workpiece be provided with components which differ from one another, for example that a circuit board be provided with electrical posts which have been plated with an electrical contact metal e.g. gold, over different areas of the posts, the present invention is intended to provide apparatus which can meet this requirement under continuous operation.

The apparatus referred to above by way of example, comprise means for feeding the strip of components to strip severing means for severing the leading component of the strip therefrom and means for inserting the severed leading component into the workpiece.

In apparatus according to the invention, a row of strip feed units are provided, each for feeding a different strip of components towards the severing means and the inserting means, means also being provided for moving the row of strip feed units lengthwise thereof to align a selected feed unit at a time, with the severing and inserting means, for feeding a selected strip of components thereto. Thus, there may be applied to the workpiece a number of components that differ from one another, in accordance with the number of the strip feed units provided.

The versatility of the apparatus can be augmented by arranging for the insertion means to be adjustable to insert predetermined ones of the components to different depths in the workpiece.

Each strip feed unit may be arranged to be moved transversely of said row between a position in line with the remaining strip feed units, to allow a desired strip feed unit to be selected as described below, and an advanced position towards the severing means, in which the strip feed unit is actuable to feed its strip.

The strip feed units may be arranged on a carrier plate which is movable lengthwise of the row, for example by means of one or more drive units. One drive unit may be arranged to drive the carrier plate over part of its path of travel and another over the remainder thereof. Where piston and cylinder units are used as the drive means, the piston and cylinder units may be arranged in side by side relationship in order to conserve space.

The means for adjusting the insertion depths of the components may conveniently comprise a toggle linkage connecting the insertion means to drive means therefor, means being provided for securing the toggle linkage in a broken or a straightened condition as required.

The strips may be fed to the strip feed units, from sources of supply of strip form components, by means of a feed assembly having a first portion which is moveable with the row of strip feed units and a second portion which is fixed and which is provided with feed devices arranged to feed the strips so as to form loops on said first portion, to be taken up by the feed units as required.

For a better understanding of the invention and to show how it may be carried into effect, reference will now be made by way of example to the accompanying drawings, in which:

FIG. 7 is a perspective view of the feed assembly with part removed with showing parts of the assembly in a first position;

FIG. 8 is a similar view to that of FIG. 7 but showing said parts in a second position;

FIG. 10 is a diagrammatic plan view of part of the feed assembly showing parts thereof in a first position;

FIG. 11 is a similar view to that of FIG. 10 but showing said parts in a second position;

FIG. 13 is a fragmentary frontal view of the apparatus, with parts removed and showing a component insertion depth selection assembly of the apparatus;

FIG. 14 is an exploded perspective view of the the inserting depth selection assembly;

FIG. 15 is a view of the insertion depth insertion assembly taken on the lines 15—15 of FIG. 16;

FIG. 16 is a view taken on the lines 16—16 of FIG. 15;

FIG. 21 is a plan view of a component supply assembly of the apparatus taken in the direction of the arrow 21 in FIG. 1;

FIG. 22 is a side view of the supply assembly;

FIG. 23 is a diagrammatic perspective view illustrating, in outline, an aspect of the operation of the apparatus; and FIG. 24 is a perspective view of part of a strip of electrical components which may be used with apparatus.

Figure 1:
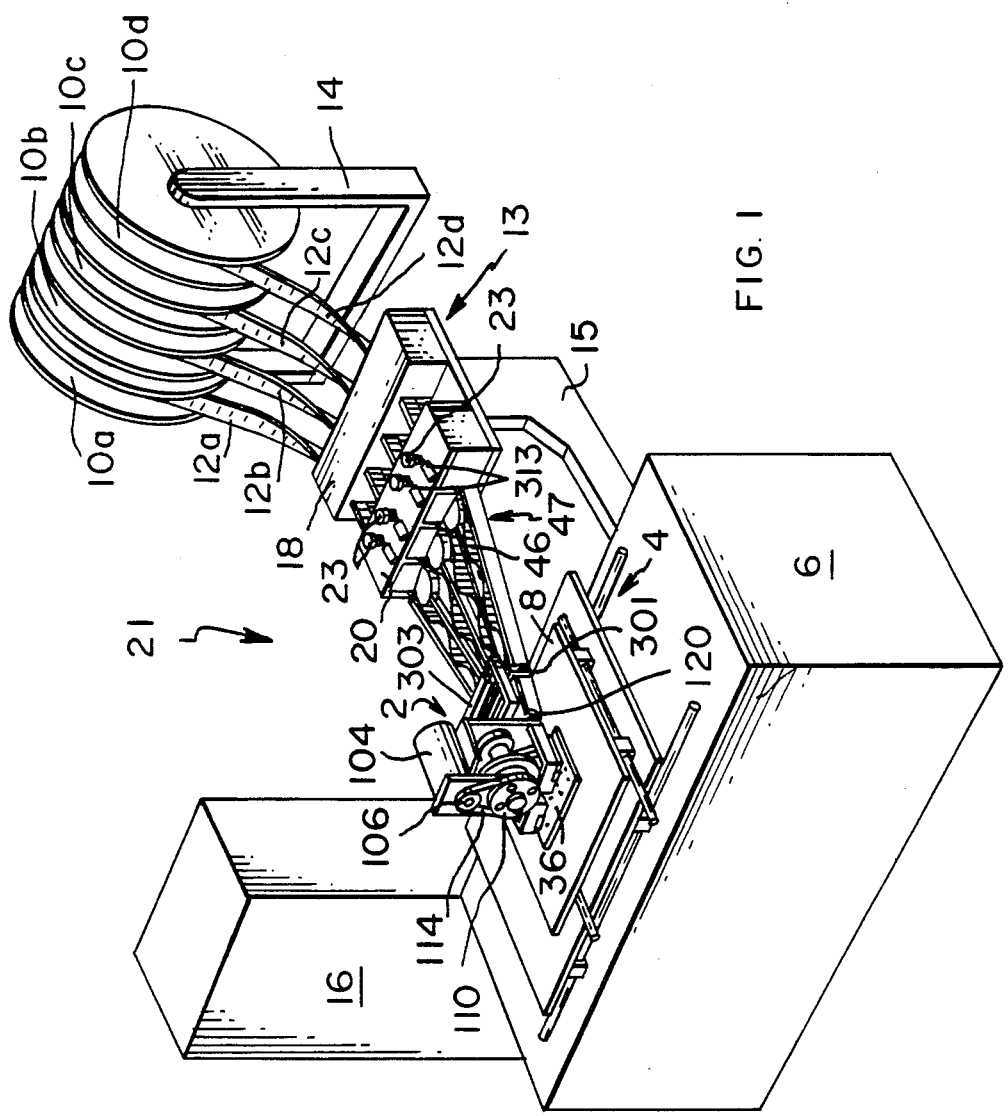
FIG. 1 is a perspective view of apparatus for selectively severing components in the form of electrical posts, from a plurality of strips of such posts and inserting the severed posts one by one into a workpiece in the form of a circuit board, the apparatus being shown in a typical environment, in association with an X-Y table mounted on a worktable and a control unit for the apparatus.

As shown in FIG. 1, the apparatus which is generally referenced 2, is mounted above an X-Y table 4, which is in turn mounted upon a worktable 6. Lower tooling associated with the apparatus, which tooling is not shown, but which may be in accordance with the teaching of patent application Ser. No. 582,996, filed on Feb. 24, 1984, and which is incorporated herein by reference, is mounted in the worktable 6 below the X-Y table 4. A workpiece in the form of a circuit board 8 is positioned on the X-Y table above an opening (not shown) therein. Discrete sources of strip components in the form of storage reels 10a, 10b, 10c and 10d upon which are wound strips 12a, 12b, 12c and 12d, respectively, of electrical posts, are mounted on a support 14. The strips are led through a component strip supply assembly 13 supported on a bracket 15 fixed to the table 6, into the apparatus 2 from the rear (as seen in FIG. 1). Beside the worktable 6 is an electronic control unit 16. Since the X-Y table 4 and the unit 16 are conventional, they will not be further described here.

The strips 12a to 12d, are different, in that the posts thereof have been plated with electrical contact metal, for example, gold, over different areas. As will be described below, the apparatus 2 is adapted to insert, selectively, and according to a predetermined program stored in the unit 16, electrical posts severed from the strips 12a to 12d into respective ones of the holes 36 in the circuit board 8. The apparatus is also arranged to insert the posts into the holes 36 to different depths in accordance with the program. On its way to the apparatus 2, each strip is fed through a strip aligning unit 18 and a strip feeding and shear unit 20.

The manner in which one of the strips, in this example, the strip 12a, is processed by means of the apparatus 2, will now be described in outline with reference to FIG. 23. As shown in that Figure, the strip 12a (and indeed each of the strips 12b to 12d) as fed from the reel 10a, comprises a first carrier strip 22 provided with index holes 24, with which are integrally formed electrical posts 26 which depend from the strip 22 in constantly spaced, parallel relationship. Intermediate their ends, the posts 26 are connected together by a second carrier strip 28, slug portions 30 of which extend between the posts 26. On the side of the carrier strip 28, remote from the carrier strip 22, each post 26 is formed with an enlarged mounting portion 32, intermediate the strip 28 and the free end portion 34 of the post 26. The mounting portion 32, which is split longitudinally of the post 26, is oversized with respect to the holes 36 in the circuit board 8, the two parts of the split mounting portion frictionally engaging one another as the post is inserted into the hole 36. Such a post, which is described in U.S. Pat. No. 4,186,982, which is incorporated herein by reference, may require an insertion force of some 50 pounds in order to force it into the hole, and a similar force in order to extract it therefrom.

After the strip 12a has been oriented in a vertical plane, by means of the corresponding aligning unit 18, it is fed towards the apparatus 2 by a feed wheel 23 of the corresponding unit 20, teeth of which engage in the posts 26 of the strip 12a and the strip 22 is then engaged between a shear bar 38 in the corresponding unit 20, which bar is advanced to cooperate with the edges of a slot 40 in a slugout plate 42 in the unit 20 to shear out a slug 44 of the carrier strip 22 to separate it from a predetermined number, for example, 10, of the posts 26. The wheel 23 feeds the strip 12a into a loop cage channel 46 of a loop tray 47 (FIG. 1) of the assembly 13 to form a shallow loop in the channel 46 to be taken up by a feed pawl 48 of a strip feed unit (described below) individual to the strip 12a. Upon the emission of a signal by the control unit 16, the pawl 48 advances the strip 12a by the centerline distance between adjacent posts, that is to say the pitch of the strip 12a, to position the leading post 26' of the strip 12a between jaws 52 and 54 of a post inserter 50, which are in an open position. The jaws 52 and 54 are then closed about the post 26', by means described below, to grip the post 26', after a severing punch 56 and a severing die 58 of the apparatus 2 are moved towards one another, by means described below, to shear out the slug 30 of the carrier strip 28 by which the post 26' is connected to the next adjacent post 26. The punch 56 and the die 58 are then moved apart from one another and the inserter 40, with the post 26' gripped between its jaws, is driven down by means described below to insert the portion 34 of the post 26' into a hole 36 therebeneath in the board 8. As the inserter 50 descends, a tool support 60 of said lower tooling is raised to abut the lower face of the circuit board 8 to support it as the post 26' is inserted into the hole 36, the portion 34 of the post 26' being received in a hole 62 in the tool 60, according to the teaching of said patent application Ser. No. 582,996. When the post 26' has been fully inserted into the hole 36, being retained therein by means of its mounting portion 32, the tool 60 is lowered away from the board 8 and the inserter 50 is raised, leaving the post 26' secured in the hole 36. When the inserter 50 has reached its fully retracted position, the jaws 52 and 54 are opened, so allow the strip 12a to be advanced again by means of the feed pawl 48, to position said next adjacent post 26 between the jaws 52 and 54.

The apparatus 2 can be used independently of the lower tooling, for example, with a passive board support or with workpiece indexing means other than an X-Y table.

The manner in which the apparatus is arranged to select for insertion into a given hole 36 in the board 8, a post from a desired one of the strips 12a to 12d, will now be described in outline with reference to FIGS. 12A to 12D which are diagrammatic.

As shown diagrammatically in these figures, the strips 12a to 12d, which extend from the assembly 13 into the rear of the apparatus 2, are each received in an individual one of strip feed units 64, 66, 68 and 70 arranged in a row extending across the apparatus 2. These units are moveable, together, that is to say as a body, laterally of the apparatus 2 (leftwardly and rightwardly as seen in FIGS. 12A to 12D) and each unit is individually moveable forwardly and rearwardly of the apparatus 2, (downwardly and upwardly as seen in FIGS. 12a to 12d). Each feed unit 64, 66, 68 and 70 has a pair of recesses 71 and 72 in which are engageable, respectively, an end portion of a feed unit advance and retraction arm 74 and an end portion of a strip feed arm 76. The arm 74 is swingable, by means described below, to move a selected one of said feed units forwardly and rearwardly of the apparatus 2, the arm 76 being swingable, by means described below, to operate the feed pawl 48 of said selected feed unit to advance the strip pertaining thereto. The arm 26 can only operate the pawl 48, for reasons described below, when the selected feed unit is in its advanced or feed position (see for example the feed unit 70 in FIG. 12A). Means, described below, are provided for moving the units 64 to 70, laterally of the apparatus 2 in either sense.

Figure 12A:
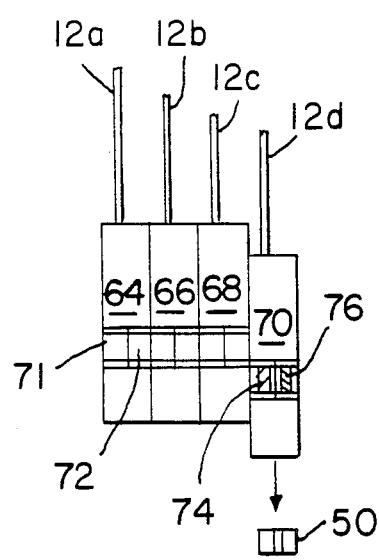
FIGS. 12A to 12D are diagrammatic plan views illustrating, in outline, the operation of the feed assembly.
Figure 12B:
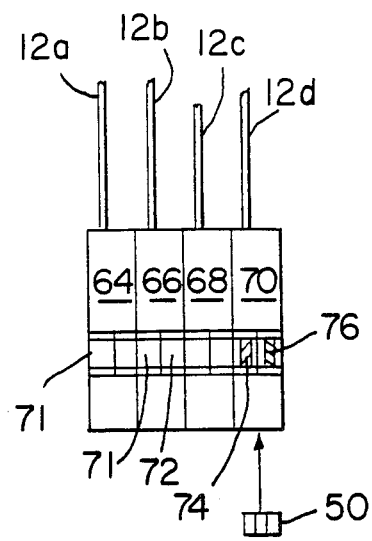
Figure 12C:
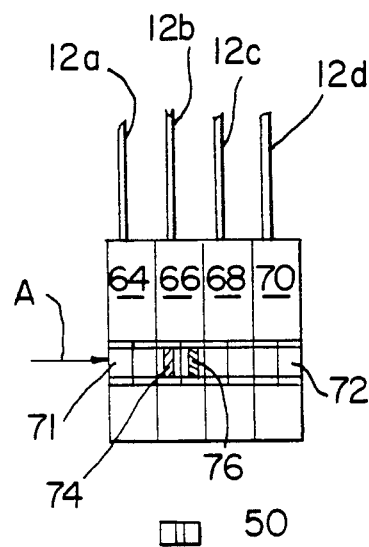
Figure 12D:
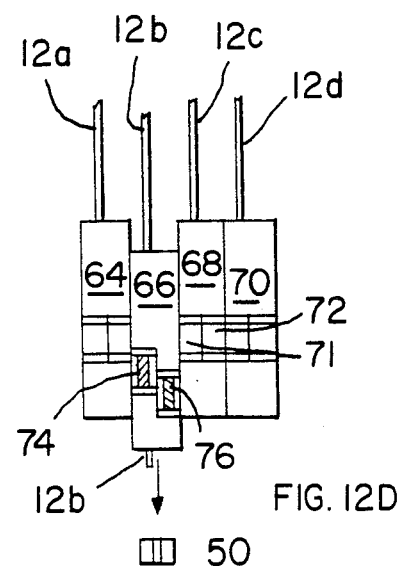

Let it be assumed for example, that the unit 70 was advanced to its feed position as shown in FIG. 12A, in alignment with the inserter 50, to feed the strip 12d to the inserter 50 and that following that insertion operation the leading post of the strip 12b is to be applied to the board 8. To this end, the arm 74 is swung to retract the unit 70 as shown in FIG. 12B so that the recesses 71 and 72 of all the units 64, 66, 68 and 70 are in lateral alignment as shown in FIG. 12B. The units 64, 66, 68 and 70 are now moved as a body, from left to right, as seen in FIG. 12C to align the unit 66 with the inserter 50, the arms 74 and 76 being thereby passed from the recesses 71 and 72 of the unit 70 through those of the unit 68 to engage in the recesses 71 and 72, respectively, of the unit 66. The arm 74 is now swung to advance the unit 66 as shown in FIG. 12D to its feed position and the arm 76 is swung to advance the pawl 48 of the unit 66 to feed the strip 12b forward to the inserter 50. The pawl 78 is then retracted by means of the arm 76 and the arm 74 is moved to retract the unit 66 into line with the units 64, 68 and 70 ready for the next strip selection operation.

The loop tray 47 is arranged to follow the lateral movements of the row of feed units 64, 66, 68 and 70, as explained below.

Figure 17:
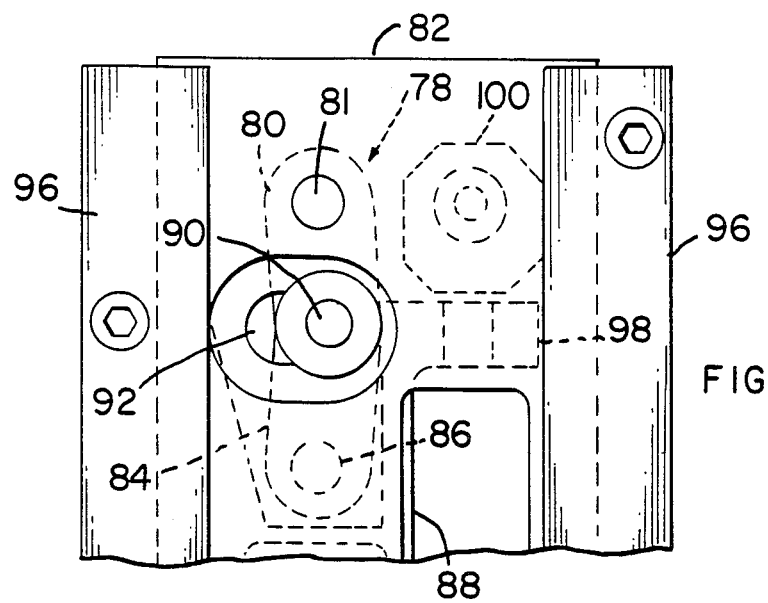
FIG. 17 is a diagrammatic fragmentary front view showing details of the insertion depth selection assembly with parts thereof in a first position.
Figure 19:
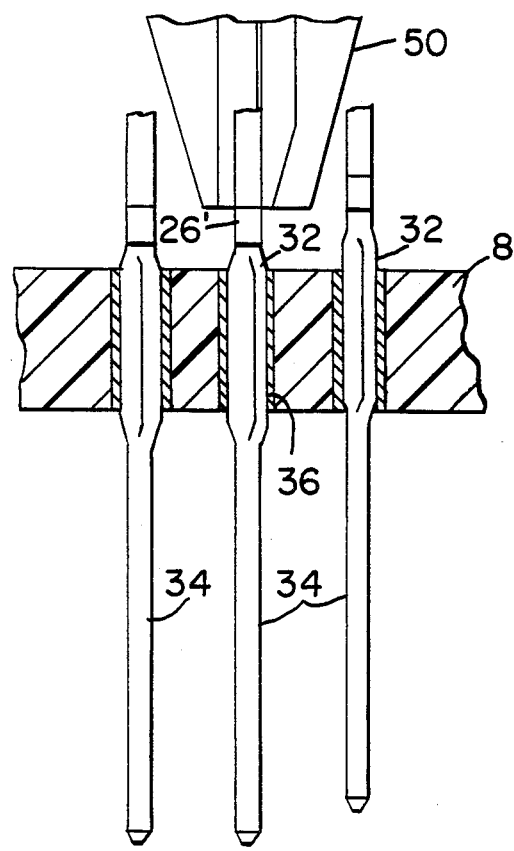
FIG. 19 is a diagrammatic side view, shown partly in section illustrating the insertion of a component into a circuit board when said parts are in the position in which they are shown in FIG. 17.
Figure 18:
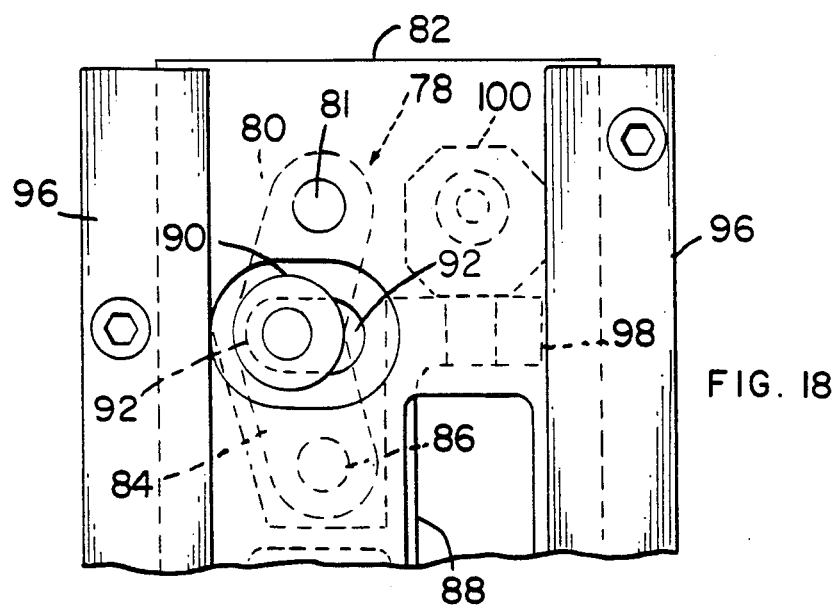
FIG. 18 is a similar view of that of FIG. 17 showing said parts in a second position.
Figure 20:
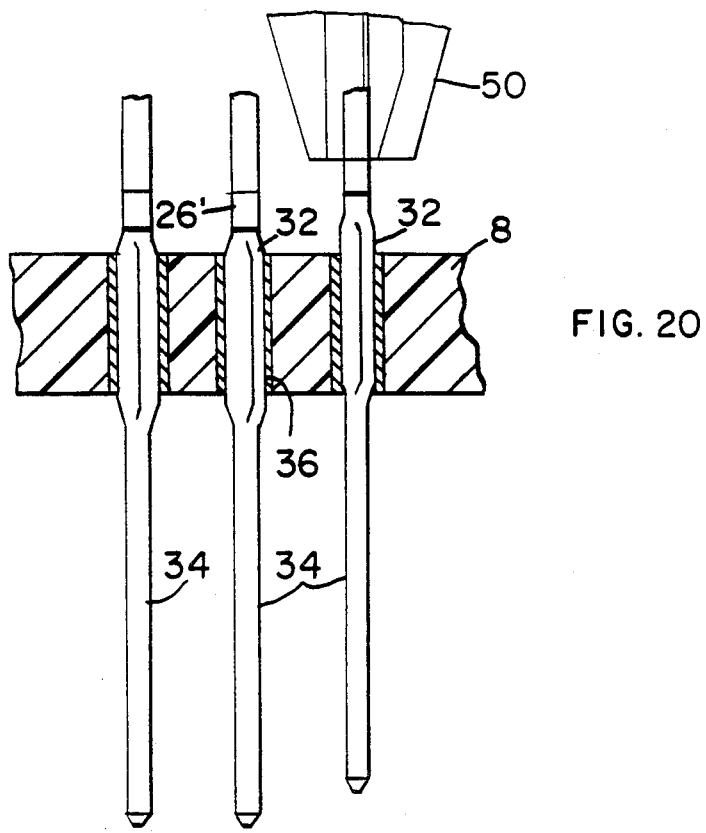
FIG. 20 is a similar view to that of FIG. 19, but showing the insertion of a component into a circuit board when said parts are in the position in which they are shown in FIG. 18.

The manner in which the apparatus 2 is adapted to select the insertion depth of a post of any one of the strips 12a to 12d, will now be described in outline with reference to FIGS. 14 and 17 to 20. As shown in FIGS. 14, 17 and 18, a toggle linkage 78, which is mounted above the inserter 50 in the apparatus 2, as will be described below, has a first link 80 pivoted at 81 to a main inserter slide 82 and a second link 84 pivoted at 86 to an insertion depth selection slide 88 within the slide 82. The links 80 and 84 have a common pivot pin 90 which is slidable laterally in a slot 92 in a front plate 94 of the slide 82, the slide 88 being vertically slidable within the slide 82 which is itself vertically slidable in a slide plate 96 on the frame 102 by means described below. The inserter 50 is attached to the pivot pin 86, as described below. The slide 88 has a laterally projecting arm 98 engageable with a stop 100 secured to the slide 82 to limit upward movement of the slide 88. The pivot pin 90 is moveable lengthwise of the slot 92 by insertion depth adjustment drive means described below. Where the post is to be inserted to the maximum required depth into the hole 36 in the board 8 as shown in FIG. 19, the pivot pin 90 is shifted to its rightmost (as seen in FIG. 17) position along the slot 92 so that the linkage 78 is in a straightened condition whereby the inserter 50 is in its lowermost position relative to the slide 88. However, where the post is to be inserted to its minimum depth in the hole 36 as shown in FIG. 20, the pivot pin 90 is moved to its leftmost position in the slot 92, as shown in FIG. 18, so that the toggle linkage 78 is in a broken condition whereby the inserter 50 is in its uppermost position in relation to the slide 88.

Excepting for the parts associated with the strip and insertion depth selection facilities described in outline above, the apparatus is in accordance with the teaching of patent application Ser. No. 582,996 mentioned above, so that only those aspects of the apparatus which are necessary for a proper understanding of the present invention are described herein.

The apparatus will now be described in greater detail. The apparatus comprises a frame generally referenced 102 to the upper part of which is secured a stepping motor 104 (FIG. 1), an electric fan 106 (FIG. 2) being secured to the frame 102 for cooling the motor 104. A sprocket wheel 106 secured to the shaft of the motor 104 is connected to a drive sprocket wheel 110 fixed to a main cam shaft 112 of the apparatus 2, by means of a toothed belt 114. On the front face of the frame 102 is revolution counter 116 for the motor 104. The cam shaft 112 is mounted in bearings 117 (FIG. 3) in the frame 102 and carries a disc cam 118 and a barrel cam 120. The disc cam 118 has in its rear face, cam tracks receiving cam followers 122 and 124, for operating the punch 66 and die 58 through respective linkages 126 and 128 according to the teaching of said patent application Ser. No. 582,996. In its forward face, the disc cam 118 has a cam track 130 (FIG. 16) receiving a cam follower 132 for driving the slides 82 and 88 in vertical reciprocating movement and a cam track receiving a cam follower 135 (FIG. 2) on a lever 118 having an arm 134 carrying a roll 136 acting on a slide 137 for closing the jaws 52 and 54 about a post 26' against the action of springs 138 (FIG. 13); also according to the teaching of the said patent application Ser. No. 582,996.

Figure 3:
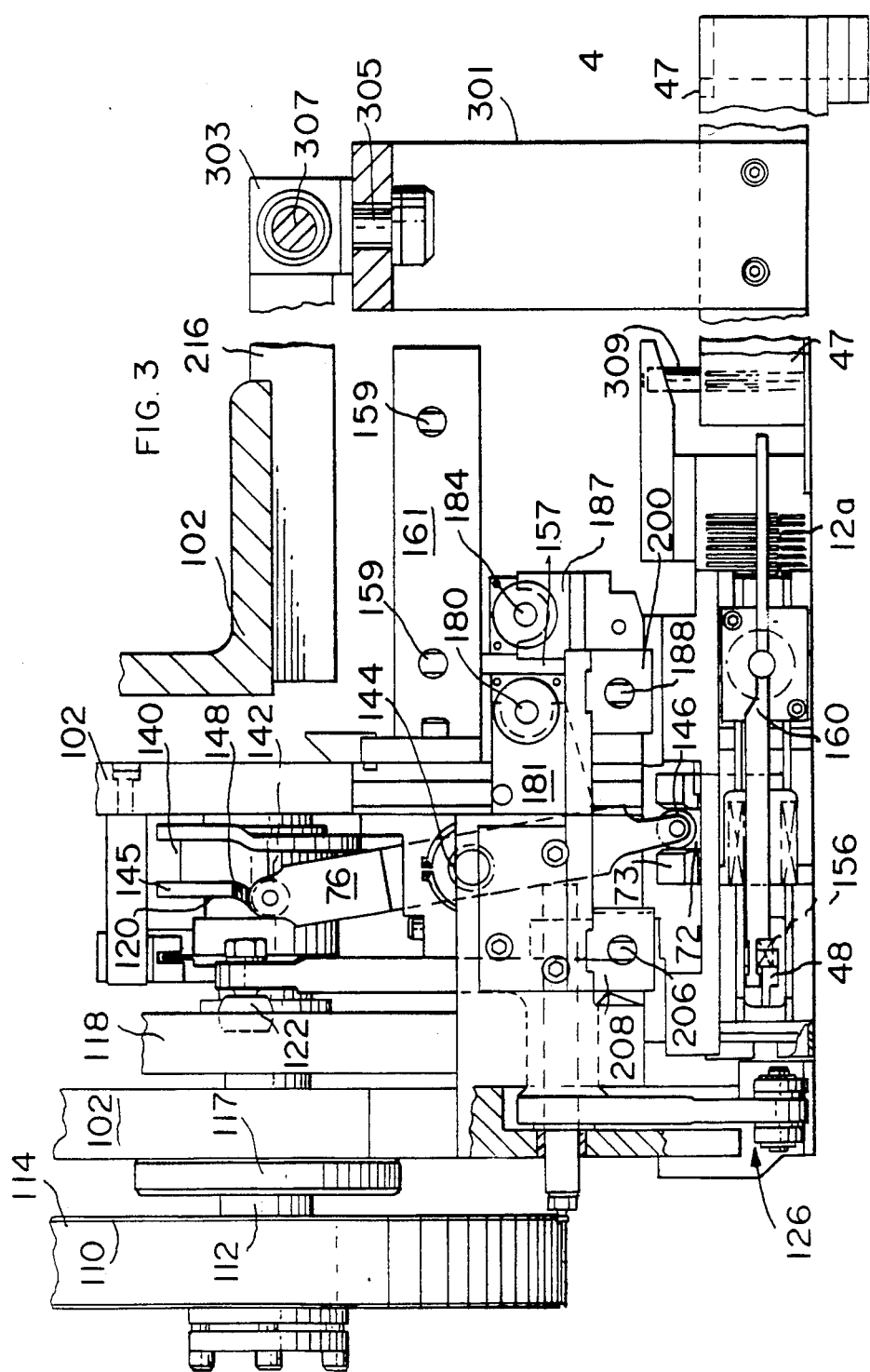
FIG. 3 is a side view of the apparatus, with parts removed, taken from the direction of the arrow 3 in FIG. 2.

As best seen in FIG. 3, barrel cam 20 has a peripheral cam track 140 receiving a cam follower 142 connected to the upper end of the feed arm 76 which is pivoted to the frame at 144, the other end of the arm 76 carrying a roller 146 which is engageable in the recess 72 of a selected feed slide unit 64, 66, 68 or 70. The cam track 140 has, in its forward sidewall 145, an escape opening 148 for the cam follower 142, through which the follower 142 passes when the arm 76 is in the angular position in which it is shown in FIGS. 3 and 7 when a feed unit 64, 66, 68 or 70, in the recess 72 of which the follower 146 is engaged, is in its retracted, i.e. rearward position.

Figure 2:
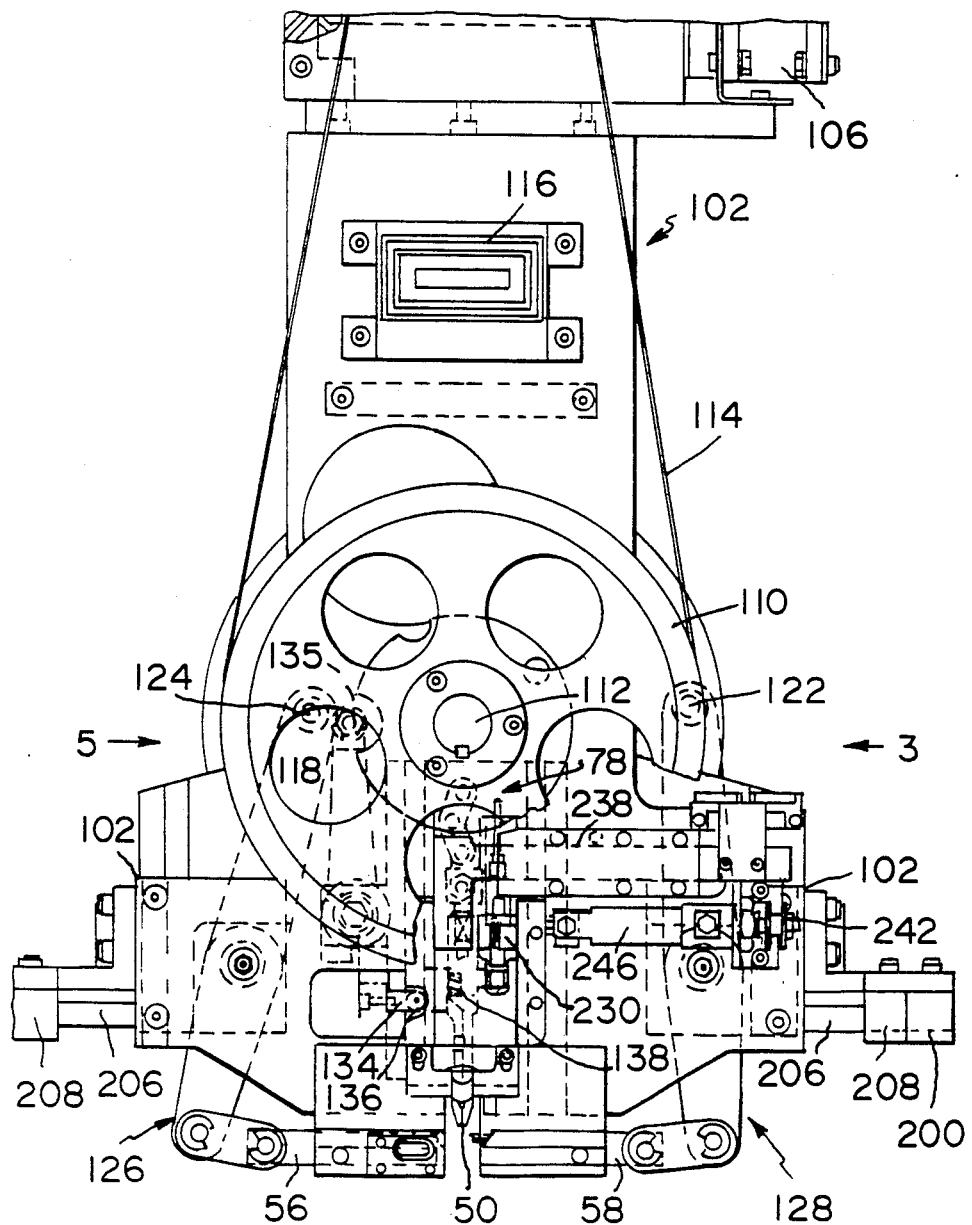
FIG. 2 is a front view of the apparatus with parts removed.
Figure 4:
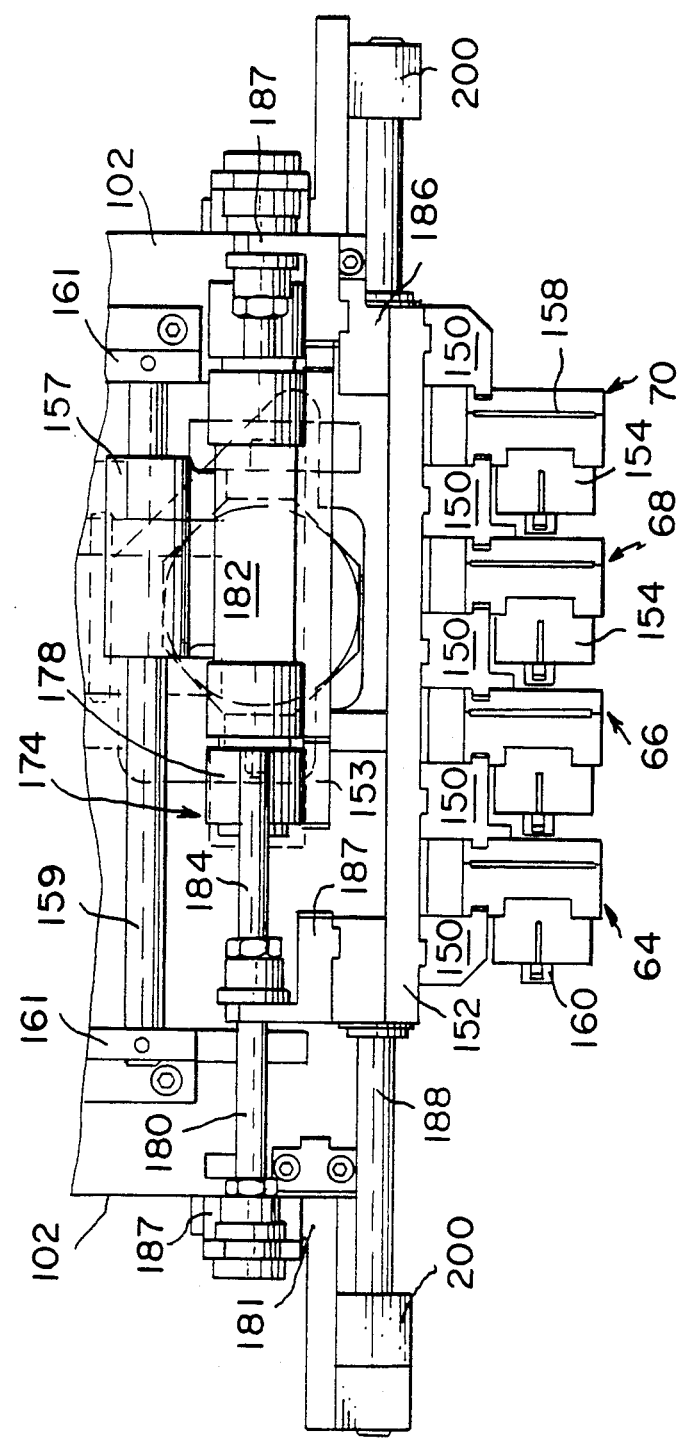
FIG. 4 is a fragmentary rear view of the apparatus taken from the direction of the arrow 4 in FIG. 3.
Figure 5:
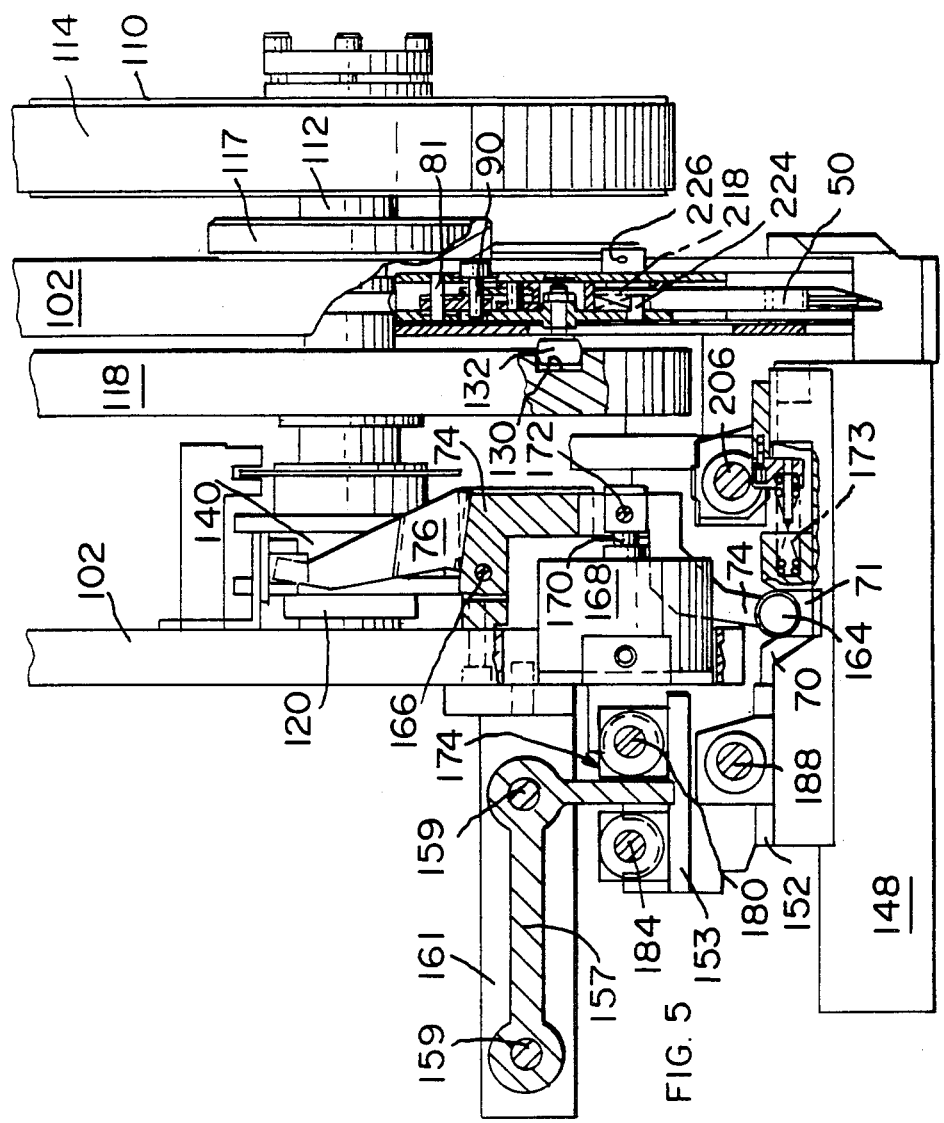
FIG. 5 is a fragmentary side view of the apparatus, shown partly in section, taken in the direction of the arrow 5 in FIG. 2.
Figure 6:
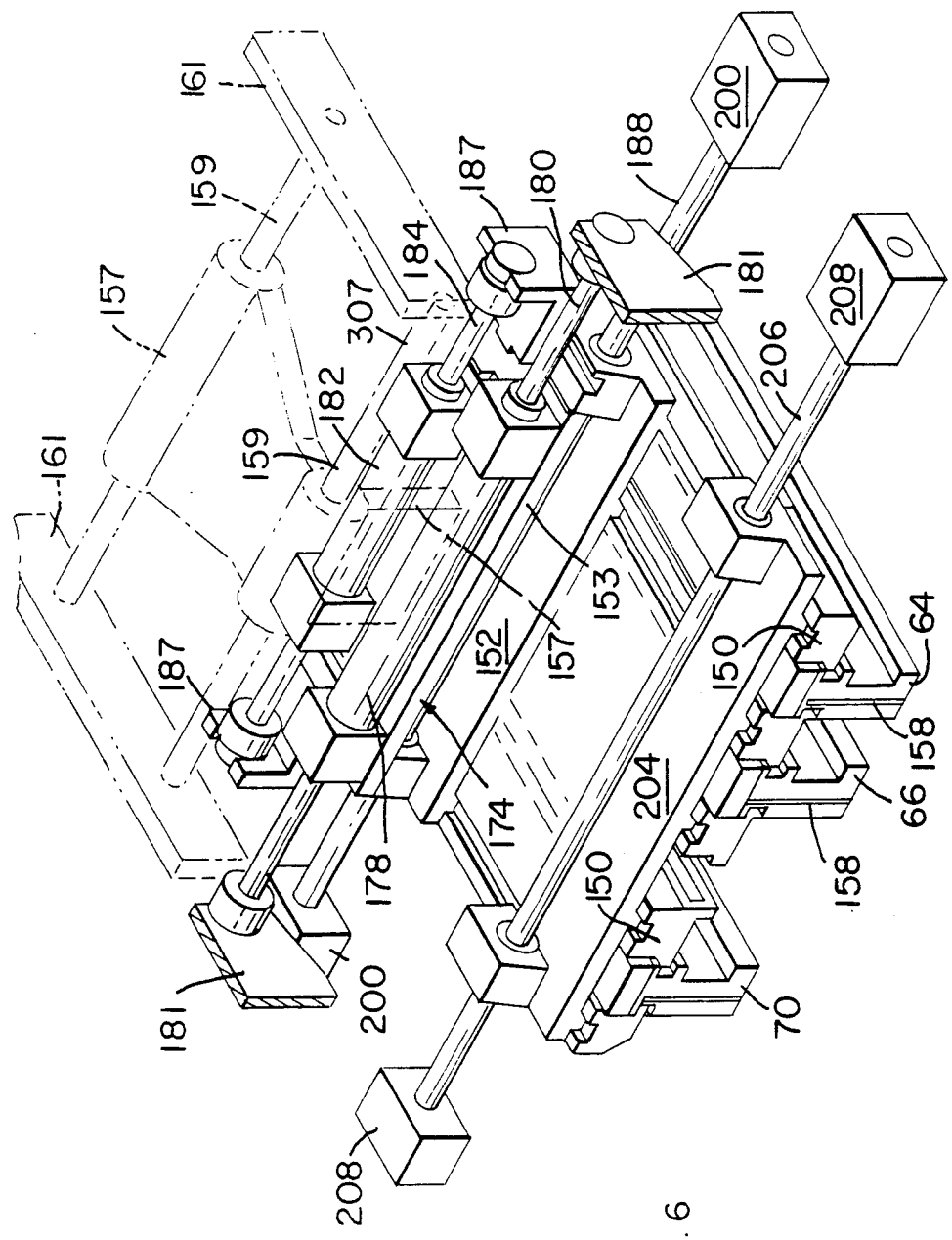
FIG. 6 is a perspective view, taken from above, showing a component feed assembly of the apparatus with part removed.
Figure 9:
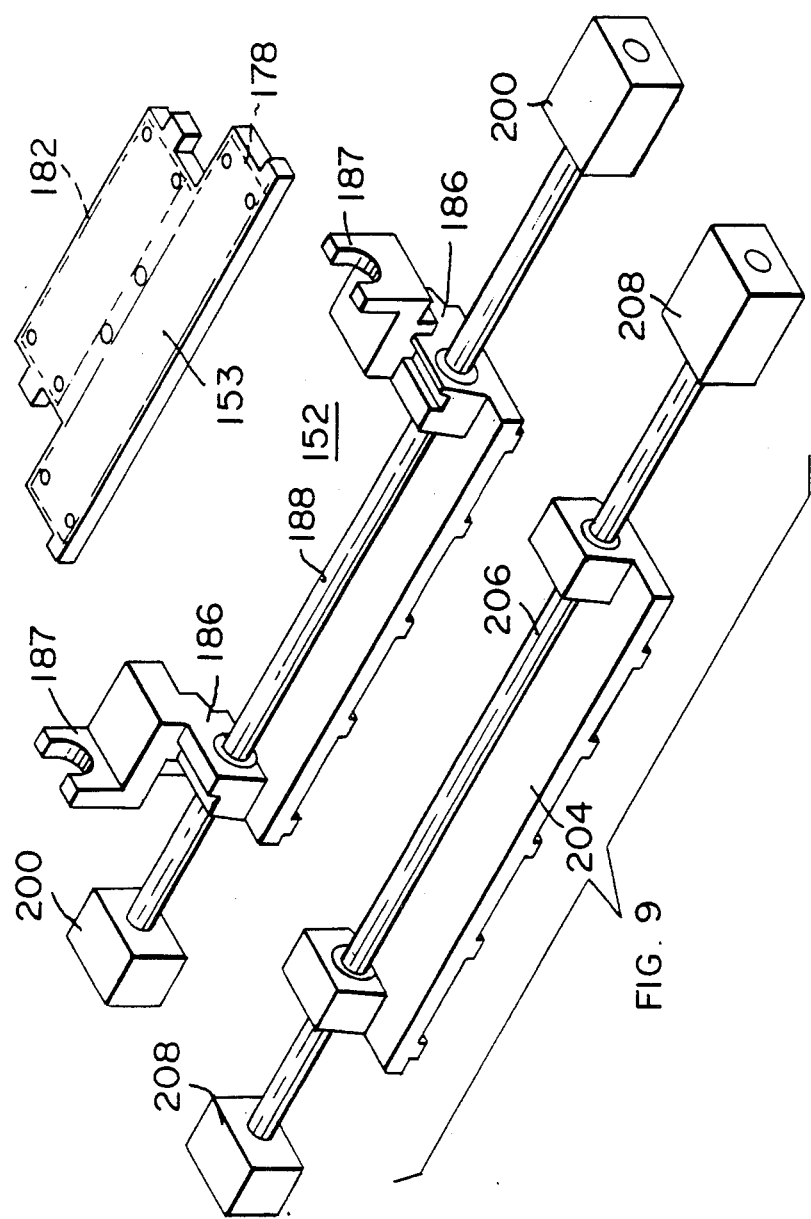
FIG. 9 is a perspective view of some details of the feed assembly.

As best seen in FIGS. 4 and 6 the feed slide units 64, 66, 68 and 70 are slidably mounted in gibs 150 screwed to carrier plates 152 and 204, the feed units being slidable in the gibs 150 forwardly and rearwardly of the apparatus 2 and the plates 152 and 204 being mounted for sliding movement laterally of the apparatus on rods 188 and 206 carried by blocks 200 and 208 secured to the frame 102 as best seen in FIG. 2. The recess 72 of each feed unit 64, 66, 68, 70 is defined by projections 73 upstanding from a feed slide 154 (as best seen in FIGS. 7 and 8) carrying the feed pawl 48 of said unit which is loaded by a spring 156 (FIG. 3) according to the teaching of said patent application Ser. No. 582,996. When the arm 76 is moved in a clockwise (as seen in FIG. 8) sense by the engagement of the cam follower 142 with the walls of the cam track 140, the pawl 48 advances the strip in the feed unit by an increment and upon opposite angular movement of the arm 76, the pawl 48 rides over a post 26 of the strip against the action of the spring 156 in preparation for its next feed stroke. Each strip 12a to 12d of posts passes through a guide channel 158 in the corresponding feed unit and is held against a wall thereof by means of a spring loaded stock drag device 160. The recesses 71 of the units 64, 66, 68 and 70 are defined by projections 162 upstanding therefrom, between which a roller 164 on one end of the arm 74 engages as best seen in FIG. 15, the other end of the arm 74 being pivoted at 166 to the frame 102, just above a piston and cylinder unit 168 for driving the arm 74, which is secured to the frame 102, as best seen in FIG. 5. The piston rod 170, of the unit 168 is pivoted to the arm 74, at 172, intermediate the ends of the arm 74, whereby the unit 168 is actuable to swing the roller 164 to advance the selected feed unit, against the action of a return spring 173 (FIG. 5).

As will now be described with reference to FIGS. 4, 6 and 9 to 11, the units 64, 66, 68 and 70 are translated laterally of the apparatus 2 to enable the rollers 146 and 164 of the arms 76 and 74, respectively, to be engaged in selected respective recesses 71 and 72 of said units, by means of a main pneumatic piston and cylinder unit 174 secured to a T-shaped carrier plate 153 above the carrier plate 152. The cylinder 178 of the unit 174 is slidable along a piston rod 180 secured at each end to the frame 102 by way of blocks 181, the unit 176 having a piston rod 184 secured to the carrier plate 152, at each end, by means of brackets 187. The plate 153 is supported by a slide 57 secured thereto and being moveable across the apparatus 2 on rods 159 fixed to spaced plates 161 which are in turn fixed to the frame 102 (see FIGS. 3, 5 and 6). As the cylinder 178 moves along its piston rod 180 it drives the plate 153 along the rods 159, in its direction of travel, and thus the plate 152, through the brackets 187. The unit 176 can advance its piston rod 188 in either direction to move the plate 152 in said direction by the distance between two of the feed units, after the cylinder 178 has reached the corresponding end of its travel. For example, when the unit 68 has been aligned with the inserter 50 as shown in FIG. 10, the cylinder 178 has reached on end of its stroke and so cannot be used to bring the unit 70 into alignment with the inserter 50. Accordingly, in order to do this, the cylinder 182 is actuated to advance its piston rod 184, leftwardly (as shown in FIG. 11), to shift the plate 152 in that direction relative to the plate 153. The units 174 and 176 are, of course double acting.

The loop tray 47 of the strip supply assembly 13 is carried by a bracket 301 (FIGS. 3, 21 and 22) pivoted to a slide 303 by means of a vertical pivot pin 305, the slide 303 being freely slidable along a rod 307 extending laterally of the apparatus 2 and being supported by arms 216 secured to the frame 102 as best seen in FIG. 3. The tray 47 is pivotally connected, for horizontal swinging movement, to the frame 102 by a pivot pin 309. The tray 47 is also pivoted, on a pivot pin 401, to the unit 20 so that as the row of feed units is moved laterally of the apparatus 2, the tray 47 can follow these movements albeit that the unit 20 is fixed by the bracket 15. The feed wheels 23 can be operated manually by means of handles 311 (FIG. 22) for setting up purposes, but are operated according to the program by means of drive piston and cylinder units 313.

As shown in FIGS. 14 and 16, the cam follower 132 has a shaft 222 secured to the slide 88. On the slide 88 is a holder 226 for a sensor (FIG. 13) for detecting the insertion force applied by the inserter 50 to the post 26', in cooperation with a projection 323 on the inserter 50 so that it can be determined whether the post has been correctly inserted or is bent. A flange 224 on the slide 88 projects therethrough beneath a spring 218 in a recess 220 in the inserter 50, a projection 225 on the slide 88 engages the top of the inserter 50. The spring 218 acts to urge the slide 88 upwardly, to assist in retaining the toggle linkage 78 in its selected position.

On the center pin 90 of the toggle linkage 78, is a cam follower 234 which engages in a form 236 on a toggle actuator bar 238 (FIG. 13) having a depending pin 240 engaged between a pair of discs 242 secured to the end of the piston rod 244 of a toggle linkage actuating piston and cylinder unit 246. When the piston rod 244 is advanced under the control of the control unit 16, the toggle linkage 78 is shifted to its straightened condition, retraction of the piston rod 244 causing the toggle linkage 78 to be moved to its broken condition. FIG. 24 shows an alternative form of strip 12', which can be used with the apparatus. In this case, the posts 26x of the strip are sheared at positions 400, substantially midway between carrier strips 22' and 28'. The posts 26x accordingly project from the circuit board 8 to a smaller height than the posts 26, after their insertion into the holes 36. For severing the carrier strip 22' from the posts 22x, the shearing means, 38, 42 would of course need to be suitably modified.

It will be apparent from the above description, that the apparatus 2 can, in accordance with the programming of the control unit 16, select for application to the board 8, posts from the strips 12a to 12d, to any desired order and can insert any of these posts into the holes 30 in the board 8 to a depth determined by the condition of the toggle linkage 76. The sensor 230 is arranged to measure the insertion force applied to each body, so that should the insertion force not fall within a range which has been predetermined by the program, for example if the pin is bent during insertion, the control unit 16 is caused by a signal from the sensor 230 to stop the apparatus and to indicate the fault upon a screen (not shown).

We claim:

1. Apparatus for selectively severing components from a plurality of strips of components and inserting each severed component into a workpiece, the apparatus comprising:

a frame;

component strip severing means and associated component insertion means on the frame;

a row of component strip feed units each for receiving one of the strips, arranged on the frame for movement lengthwise of the row and each having means for feeding said one strip along a feed path extending transversely of the row and with a component of the strip leading;

means connected to the frame for moving said row of units to bring the feed path of a selected one of said units at a time, into alignment with said strip severing means and said component insertion means;

first actuating means on the frame for actuating the feeding means of each selected unit to feed the leading component of the strip pertaining thereto to the severing means and the insertion means; and second actuating means on the frame for actuating the severing means and the insertion means to sever such leading component from its strip and then to insert it into the workpiece, and wherein each strip feed unit is movable transversely of said row, between a first position in line with the remaining strip feed units to allow a desired strip feed unit to be selected, and a feed position in which the strip feed means of the selected strip feed unit is actuable by said first actuating means to feed its strip.

2. Apparatus for selectively severing components from a plurality of strips of components and inserting each severed components into a workpiece, the apparatus comprising:

a frame;

component strip severing means and associated component insertion means on the frame;

a row of component strip feed units each for receiving one of the strips, arranged on the frame for movement lengthwise of the row and each having means for feeding said one strip along a feed path extending transversely of the row and with a component of the strip leading;

means connected to the frame for moving said row of units to bring the feed path of a selected one of said units at a time, into alignment with said strip severing means and said component insertion means;

first actuating means on the frame for actuating the feeding means of each selected unit to feed the leading component of the strip pertaining thereto to the severing means and the insertion means; and second actuating means on the frame for actuating the severing means and the insertion means to sever such leading component from its strip and then to insert it into the workpiece, and wherein each strip feed unit is movable transversely of the row of feed units, between a retracted position in which it is in alignment with the remaining strip feed units of the row and a feed position in which it is displaced towards the severing means and insertion means, the first actuating means being capable of actuating the feed means of a feed unit only when such unit is in its feed position, and means being provided for shifting each unit from its retracted position to its feed position when the feed path thereof is in alignment with said strip severing means and insertion means.

3. Apparatus as claimed in claim 2, wherein the first actuating means has a first arm for driving the feed means of each unit, said shifting means having a second arm for shifting each unit from its retracted to its feed position, each unit defining a first recess for receiving an end of said first arm and a second recess for receiving an end of said second arm, all said recesses being in register when each unit is in its retracted position, whereby upon said lengthwise movement of said row of units, the said ends of the first and second arms can pass through said recesses.

4. Apparatus as claimed in claim 3, wherein said first arm is driven by a rotary cam and bears a cam follower engaged in a cam track therein, the cam track having an escape opening for receiving the cam follower when the units are in their retracted positions.

5. Apparatus as claimed in claim 3, wherein each arm is pivotable about an axis extending at right angles to said row of units and includes a roller for engaging in the corresponding recesses of said units, the second arm being driven by a piston and cylinder unit mounted between the rotary cam and said row of units, the feeding means of each unit comprising a feed slide bearing a strip engaging pawl and having a pair of projections defining said second recess.

6. Apparatus as claimed in claim 1, wherein said means for moving the row of units comprises a first cylinder fixed to a first carrier and having a piston rod along which the cylinder is slidable, and which is connected at each end to said frame, and a second cylinder also fixed to said first carrier and having a piston rod connected to a second carrier in juxaposition with said first carrier and being secured to said units, the first cylinder being actuable to move through a working stroke to move said carriers by a first distance and the second cylinder being actuable to advance its piston rod to move the second carrier beyond the first carrier.

7. Apparatus as claimed in claim 1, wherein the insertion means comprises a component inserter which is moveable through a working stroke to a working end position, to insert said leading component into the workpiece, means being provided for adjusting said working end position thereby to adjust the extent to which the leading component is inserted into the workpiece.

8. Apparatus as claimed in claim 7, wherein the inserter is carried by a first slide connected to a second slide mounted on the frame for movement along an insertion path to drive the inserter through its working stroke, the first slide being connected to the second slide through a toggle linkage and means being provided for securing the toggle linkage in a first, straightened position and a second, broken position, to select said working end position.

9. Apparatus as claimed in claim 8, wherein the toggle linkage comprises a first link pivoted to the first slide, and a second link pivoted to the second slide, the links having a common pivot pin which is slidably received in a slot formed in the second slide and extending transversely of said insertion path, drive means being provided for moving said pin between a first position at one end of the slot and a second position at the opposite end of the slot.

10. Apparatus as claimed in claim 9, wherein the first slide is received in the second slide and means are provided for adjusting the relative positions of the slides in the direction of movement of the inserter.

11. Apparatus for selectively severing components from a plurality of strips of components and inserting each severed component into a workpiece, the apparatus comprising:

a frame;

component strip severing means and associated component insertion means on the frame;

a row of component strip feed units each for receiving one of the strips, arranged on the frame for movement lengthwise of the row and each having means for feeding said one strip along a feed path extending transversely of the row and with a component of the strip leading;

means connected to the frame for moving said row of units to bring the feed path of a selected one of said units at a time, into alignment with said strip severing means and said component insertion means;

first actuating means on the frame for actuating the feeding means of each selected unit to feed the leading component of the strip pertaining thereto to the severing means and the insertion means; and second actuating means on the frame for actuating the severing means and the insertion means to sever such leading component from its strip and then to insert it into the workpiece; and further comprising a feed assembly for feeding said strips of components to said feed units from discrete sources of said strips, the feed assembly having a first portion pivotally attached to said frame to swing about a first axis, and also being pivotable about a second axis remote from said units and a third axis between said first and second axes, said axes being parallel and extending at right angles to the direction of movement of said units to allow said first portion to follow the movements thereof, a second portion of said assembly fixed to said frame carrying means for feeding said strips towards said units, said first portion being located between said second portion and said units.

12. Apparatus as claimed in claim 11, wherein said assembly is supported by a slide moveable along a rod secured to the frame and extending in the direction of movement of said units.

13. Apparatus as claimed in claim 11, wherein said first portion comprises a channel for each strip of components, each channel being dimensioned to accommodate a loop of the strip therein.

14. Apparatus for selectively severing components in the form of electrical posts, a from a plurality of strips of electrical posts and inserting each severed post into a workpiece, the apparatus comprising:
  a frame;
  a carrier mounted on the frame for reciprocating movement in a first direction;
  a row of post strip feed units fixed to the carrier, the row extending in the direction of movement thereof;
  a strip feed slide on each unit for feeding a strip of posts extending through said unit, along a feed path perpendicular to said row and with a post of the strip leading;
  means on the frame and being common to the strips, for severing the leading post from a strip fed along said feed path;
  an inserter mounted on the frame, for inserting the severed post into the workpiece;
  at least one drive unit on the frame for moving said carrier to align the feed path of a selected one of said feed units with the strip severing means and the inserter;
  an arm pivotally mounted on the frame and being engageable with the feed slide of said selected feed unit to feed the strip pertaining thereto along said feed path;
  means for driving the inserter towards the workpiece to insert the severed leading post thereinto; and
  means connecting the inserter to said drive means, for adjusting the depth to which the leading post is inserted into the workpiece, and wherein each unit is slidable relative to the carrier in a direction perpendicular to the movement thereof and towards and away from the severing means, said arm being capable of driving said feed slide only when said unit is in an end position nearest said shearing means.

15. Apparatus as claimed in claim 14, wherein a rotary cam is provided on the frame, for driving the inserter, the inserter being connected to a cam follower engaged in a cam track of the rotary cam through a toggle linkage, means being provided for selectively retaining the toggle linkage in a first broken position and in a second straightened position.

16. Apparatus as claimed in claim 14, further comprising a sensor connected to the inserter, for measuring the insertion force applied to each post and means responsive to the sensor, for stopping the apparatus if the insertion force fails to fall within a predetermined range.

* * * * *